United States Patent [19]

Akiba et al.

[11] Patent Number: 4,592,015
[45] Date of Patent: May 27, 1986

[54] MAGNETIC BUBBLE MEMORY MODULE

[75] Inventors: Yutaka Akiba, Fujisawa; Kazuo Hirota, Yokohama, both of Japan

[73] Assignee: Hitachi, Ltd., Tokyo, Japan

[21] Appl. No.: 627,893

[22] Filed: Jul. 5, 1984

[30] Foreign Application Priority Data

Jul. 6, 1983 [JP] Japan ................. 58-121627

[51] Int. Cl.⁴ ......................... G11C 5/04; G11C 19/08
[52] U.S. Cl. ............................................ 365/2; 365/53
[58] Field of Search ...................................... 365/2, 53

[56] References Cited

U.S. PATENT DOCUMENTS 4,150,440 4/1979 Bonnie et al. ........................... 365/2
4,165,535 8/1979 Mortelmans ............................ 365/2

FOREIGN PATENT DOCUMENTS 0183695 11/1982 Japan ..................................... 365/2

Primary Examiner—James W. Moffitt
Attorney, Agent, or Firm—Antonelli, Terry & Wands

[57] ABSTRACT

A magnetic bubble memory module comprises a shielding conductor case which encloses therein an annular rectangular parallelepiped core having windings and a magnetic bubble memory chip arranged in a space defined by the annular core. The central portion of the shielding conductor case is recessed so that it is brought near the bubble memory chip. The recess may be formed in one or each of the top and bottom surfaces of the shielding conductor case. A magnet plate is disposed in the recess of the shielding conductor case. The whole assembly is covered by a magnetic shielding case.

9 Claims, 7 Drawing Figures

MAGNETIC BUBBLE MEMORY MODULE

BACKGROUND OF THE INVENTION

The present invention relates to a magnetic bubble memory module, and in particular, to such a module suitable for minimizing the module thickness and the power loss.

A magnetic bubble is a small cylindrical magnetic domain which appears in a crystal film in which the direction of magnetization in the crystal film is perpendicular to the film surface because of the strong magnetic anisotropy of the cryatal film made of a rare-earth orthoferrite or a magnetic garnet. Since the magnetic bubble can be controlled with an external magnetic field or electric current to be moved freely along the inner surface of the crystal film, functions such as a compact memory and a logic will be developed by using the magnetic bubble phenomenon.

A magnetic bubble memory was reported from the Bell Telephone Laboratories in 1967. The bubble memories have advantages that since no mechanical movable components are involved, high-speed operation and high reliability are attained as compared with magnetic tapes or disks and that since it is nonvolatile, a high-density memory can be manufactured through a rather simpler process as compared with IC memories. Therefore, the bubble memory has been used as an auxiliary storage of an electronic switching system as well as a memory for terminal equipments or microcomputers.

FIG. 1 depicts a partially cutaway view in perspective of a conventional bubble memory module, and FIG. 2 illustrates a cross section taken along line II—II of FIG. 1. Referring to these figures, a wiring board 2 is provided with a magnetic bubble memory chip 1 thereon and has external terminals 3 at an end portion thereof. On the board 2 is mounted an annular rectangular parallelepiped core 5 of soft magnetic material which is provided with a winging 4 on each of four sides thereof. The chip 1 is placed in a space defined by the annular rectangular parallelepiped core 5. A shielding conductor case 6 as disclosed in U.S. Pat. No. 4,165,535 is disposed to cover as a whole the chip 1, the windings 4 and the core 5 excepting the external terminals 3. A set of a magnet plate 7 and a magnetic shunt plate 8 is provided on each of top and bottom surfaces of the case 6. Numerals 10 represent spacers. A tubular magnetic shielding case 9 is disposed to cover the whole assembly.

As is apparent from FIG. 2, the height $H_1$ of the thus constructed magnetic bubble module is determined by the respective thicknesses of the magnetic shielding case 9, the magnet plate 7, the magnetic shunt plate 8, the shielding conductor case 6, the board 2 with the chip 1 mounted thereon, and the core 5 having the windings 4 disposed thereon.

Since magnetic bubble modules have been widely adapted in various devices or systems, it becomes indispensable to minimize the module size especially for small-sized equipment, and the reduction of the module thickness as well as a decrease of the loss have been highly desired.

When minimizing the module thickness and the loss in the case of the module structure shown in FIGS. 1 and 2, if the thickness t of the winding 4 is increased in order to reduce the loss P, the module height $H_1$ increases. On the other hand if the thickness t of the winding 4 is decreased in order to minimize the module height $H_1$, the loss P increases. Thus, the simultaneous attainment of the minimization of the module thickness and the minimization of the loss is impossible in this module structure. In FIG. 7, a curve 16 represents a relationship between the module height H and the loss P for the module structure shown in FIGS. 1 and 2. A point 19 on the curve 16 shows that the loss P is equal to $P_1$ when the module height H is $H_1$. The module height H is limited to $H_1$ in this structure.

SUMMARY OF THE INVENTION

Accordingly, it is an object of the present invention to provide a magnetic bubble memory module which enables to minimize both the module thickness and the loss.

Another object of the present invention is to improve the uniformity of a rotating field by reducing a gap between the upper and lower plates of a shielding conductor case.

To that end, in the present invention, a central portion of the shielding conductor case is recessed so that it is brought near the memory chip. This can provide a module structure in which the winding thickness t fundamentally depends only on the loss P and does not affect the module height H.

DESCRIPTION OF THE PREFERRED EMBODIMENTS

Embodiments according to the present invention will be here described by referring to the accompanying drawings.

Figure 1:
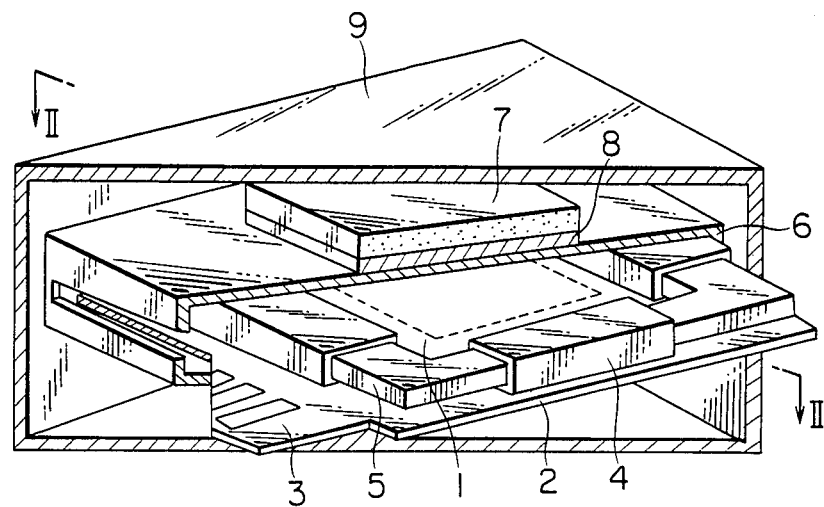
FIG. 1 is a partially cutaway view in perspective of a conventional bubble memory module.
Figure 2:
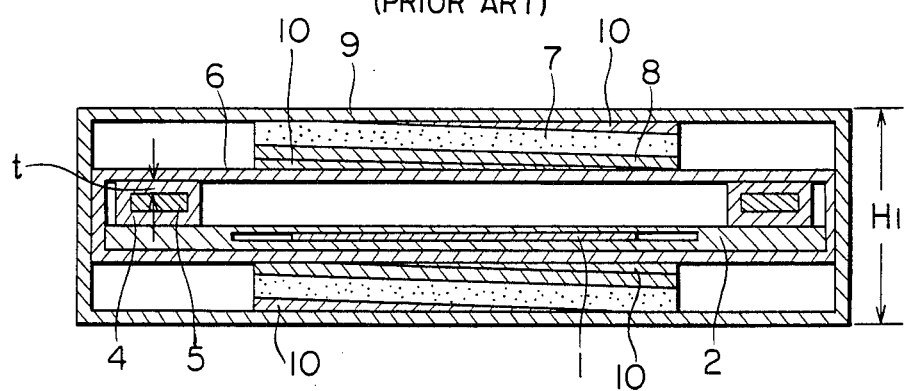
FIG. 2 depicts a section taken along line II—II of FIG. 1.
Figure 3:
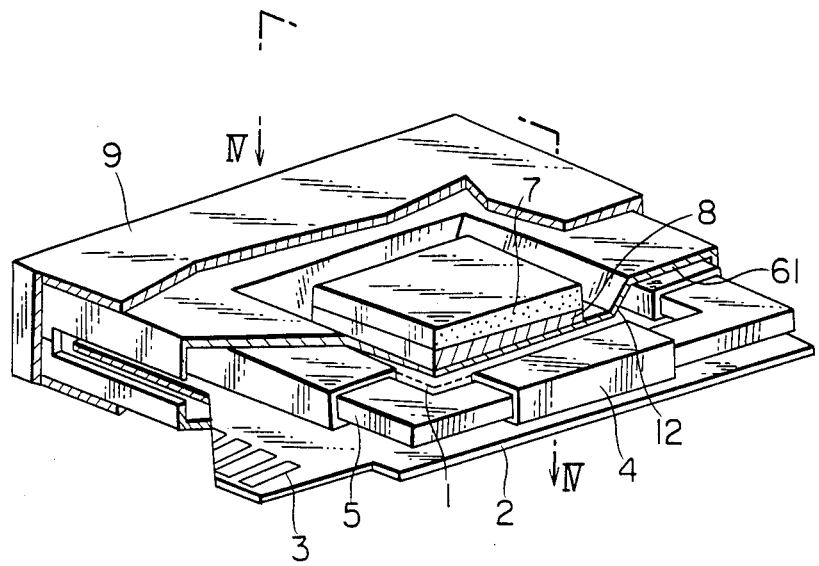
FIG. 3 illustrates a partially cutaway view in perspective of an embodiment according to the present invention.
Figure 4:
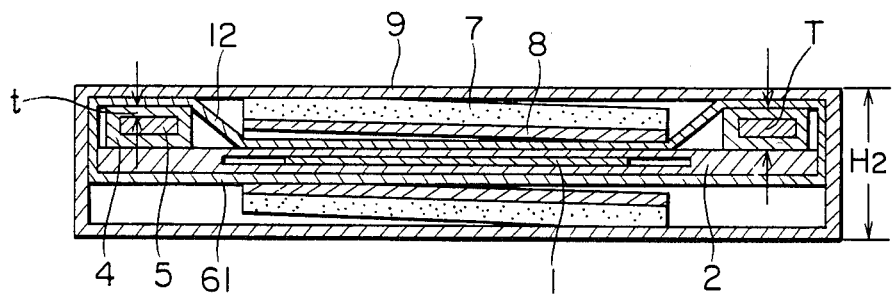
FIG. 4 is a section taken along line IV—IV of FIG. 3.

FIG. 3 is a partially cutaway view in perspective of an embodiment according to the present invention, and FIG. 4 is a cross section taken along line IV—IV of FIG. 3. In these figures, a wiring board 2 is provided with a magnetic bubble memory chip 1 thereon and has external terminals 3 at an end portion thereof in the same way as depicted in FIG. 1. On the board 2 is mounted an annular rectangular parallelepiped core 5 which is made of a soft magnetic material and provided with a winding 4 at each of four sides thereof. The chip 1 is located in a space defined by the annular rectangular parallelepiped core 5. A shielding conductor case 61 is configured to cover as a whole the chip 1, the windings 4, and the core 5 excepting the external terminals 3. A rotating magnetic field is generated to transfer bubbles within the chip 1 by use of this structure. It is characteristic of the present invention that the shielding conductor case 61 is provided with a recess 12 so that a central portion of the case 61 is brought near the chip 1.

In the example illustrated in FIGS. 3 and 4, the recess 12 is formed in a portion of the shielding case 61 above the chip 1. A set of a magnet plate 7 and a magnetic shunt plate 8 is disposed on each of the top and bottom surfaces of the shielding conductor case 61 to generate a bias field and to retain bubbles within the chip 1. The magnet plate 7 and magnetic shunt plate 8 on the top surface of the shielding case 61 are located in the recess 12. The magnetic shunt plates 8 may not be omitted in some cases. A tubular magnetic shielding case 9 is configured, like that shown in FIG. 1, to entirely cover the whole assembly.

Figure 6:
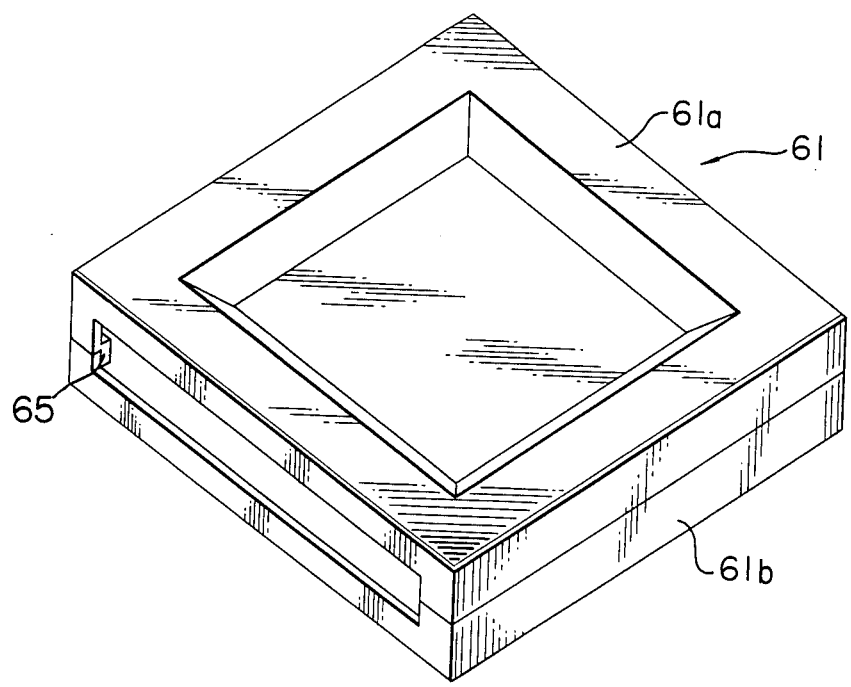
FIG. 6 illustrates a perspective view of a shielding conductor case.

As shown in FIG. 6, the shielding conductor case 61 includes upper and lower case members 61a and 61b to accommodate therein the chip 1, the circuit board 2, and the core 5 having the windings 4 thereon. The opening edge 65 of one of these case members is bent in a crank shape over a length sufficient to fit the other case member. The depth of the bent portion is approximately equivalent to the thickness of the case member.

Figure 7:
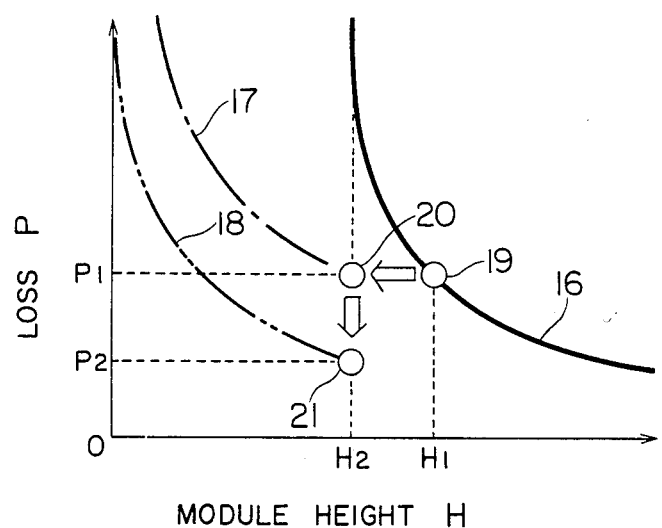
FIG. 7 is a graph showing a relationship between the module height H and the loss P.

In accordance with the above-described embodiment, since the magnet plate 7 and the magnetic shunt plate 8 can be arranged in the recess 12 disposed at the central portion of the shielding conductor case 61, the thickness T of the winding 4 and the core 5 can be made not to affect the module height $H_2$ and hence the overall height of the module can be reduced by T. A curve 17 depicted in FIG. 7 shows a characteristic of the structure illustrated in FIGS. 3 and 4. As compared with the curve 16 representing the conventional characteristic, the module height H corresponding to the loss $P_1$ can be reduced from $H_1$ to $H_2$. Thus, the module height and loss can be decreased in accordance with the present invention.

Figure 5:
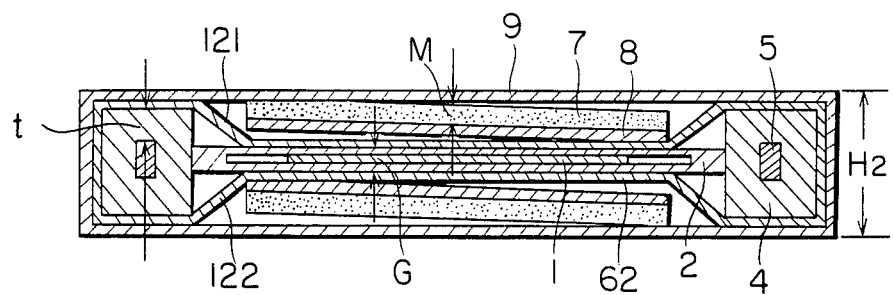
FIG. 5 depicts a cross-sectional view of another embodiment according to the present invention.

FIG. 5 illustrates another embodiment of the present invention. Referring to FIG. 5, the core 5 is disposed on the side surfaces of the board 2. Recesses 121 and 122 are symmetrically formed on the top and bottom surfaces of the shielding conductor case 62 at a central portion thereof, respectively. Upper and lower sets of magnet plates 7 and magnetic shunt plates 8 are arranged in the recesses 121 and 122, respectively.

This structure permits a reduction of the loss P by increasing the thickness t of the winding 4 without changing the module height $H_2$. A curve 18 depicted in FIG. 7 represents the characteristic of the structure illustrated in FIG. 5.

The following effects can be additionally obtained by forming the recess(es) in the shielding conductor case.

In a bias magnetic circuit comprising the magnet plates 7, the magnetic shunt plates 8 and the magnetic shielding case 9, the permeance coefficient $P_m$ is increased because of decrease of the gap between upper and lower sets of magnet plates 7 and magnetic shunt plates 8 disposed on and under the shielding conductor case 61 or 62. Therefore, the thickness M of the magnet plate 7 can be reduced, thereby lowering the module height $H_2$.

A volume v surrounded by the shielding conductor case 61 or 62 is decreased. Therefore, the VI product ($\alpha$ value v) can be reduced, thereby minimizing the size of a driver circuit for generating the rotating field.

When the gap G is decreased by disposing the recessed portions 12, 121, 122 in the shielding conductor case 61, 62, the Z component of the rotating field perpendicular to the plane of chip 1 becomes nearly to zero and the rotating field assumes only a horizontal component, thereby improving the uniformity of the rotating field.

We claim:

1. A magnetic bubble memory module comprising:
   an annular rectangular parallelepiped core of soft magnetic material provided with respective windings on four sides thereof;
   a magnetic bubble memory chip arranged in a space defined by said annular rectangular parallelepiped core; and
   a shielding conductor case which covers as a whole said windings, said annular rectangular parallelepiped core and said magnetic bubble memory chip, said shielding conductor case being provided with a recess so that a central portion of said shielding conductor case is brought near said magnetic bubble memory chip.

2. A magnetic bubble memory module according to claim 1, further comprising a magnet plate disposed in said recess of said shielding conductor case, and a magnetic shielding case which covers said shielding conductor case and said magnet plate.

3. A magnetic bubble memory module according to claim 1, wherein said shielding conductor case includes upper and lower surface parts spaced from one another so as to delimit a gap therebetween, a central portion of at least one of said upper and lower surface parts being provided with said recess so that a gap at the central portion of said shielding conductor case due to said recess is less than a gap at the peripheral portion of said shielding conductor case.

4. A magnetic bubble memory module according to claim 3, wherein each of said upper and lower surface parts is provided with said recess.

5. A magnetic bubble memory module according to claim 1, wherein said shielding conductor case includes upper and lower case members, said recess being formed in at least one of said upper and lower case members.

6. A magnetic bubble memory module according to claim 5 wherein said upper and lower case members are coupled with each other, and an edge of one of said upper and lower case members is bent in a crank shape so as to fit the other of said upper and lower case members.

7. A magnetic bubble memory module according to claim 5, wherein said recess is formed in each of said upper and lower case members.

8. A magnetic bubble memory module according to claim 7, wherein said upper and lower case members are coupled with each other, and an edge of one of said upper and lower case members is bent in a crank shape so as to fit the other of said upper and lower case members.

9. A magnetic bubble memory module comprising:
   an annular rectangular parallelepiped core of soft magnetic material provided with respective windings on four sides thereof;
   a substrate having a magnetic bubble memory chip mounted thereon, said substrate being arranged in said annular rectangular parallelepiped core;
   a shielding conductor case for accommodating therein said annular rectangular parallelepiped core and said substrate, said shielding conductor case having top and bottom surfaces each of which is recessed at a central portion thereof;
   magnetic plates disposed in said central recessed portions of said shielding conductor cases, respectively; and
   a magnetic shielding case which contains said shielding conductor case.

* * * * *